United States Patent [19]
Chang

[11] Patent Number: 5,831,894
[45] Date of Patent: Nov. 3, 1998

[54] METHODS OF PROGRAMMING AND READING ONE TIME PROGRAMMABLE READ ONLY MEMORY

[75] Inventor: Kuang-Yeh Chang, Taipei City, Taiwan

[73] Assignee: United Microelectronics Corp., Taipei, Taiwan

[21] Appl. No.: 103,958

[22] Filed: Jun. 24, 1998

[30] Foreign Application Priority Data

Apr. 27, 1998 [TW] Taiwan .................................. 87106432

[51] Int. Cl.$^6$ ........................... G11C 17/00; G11C 16/04
[52] U.S. Cl. ...................................... 365/104; 365/185.18
[58] Field of Search .............................. 365/104, 230.03, 365/185.03, 185.18

[56] References Cited

U.S. PATENT DOCUMENTS

| | | | |
|---|---|---|---|
| 5,283,759 | 2/1994 | Smith | 365/104 |
| 5,675,547 | 10/1997 | Koga | 365/230.03 |
| 5,745,411 | 4/1998 | Usami | 365/185.18 |

*Primary Examiner*—David Nelms
*Assistant Examiner*—Trong Phan
*Attorney, Agent, or Firm*—Thomas, Kayden, Horstemeyer & Risley, L.L.P.

[57] ABSTRACT

The read only memory includes a number of word lines and a number of bit lines. The word lines and the bit lines are arranged in a matrix. Between every two of the bit lines and on every word line there forms a memory cell. The two bit lines of the memory cell are a first bit line and a second bit line. The method of programming includes the following steps. The first bit line is supplied with a first voltage. The second bit line is supplied with a second voltage. The word line is supplied with a third voltage. Bit lines at the same side of the first bit line are supplied with the first voltage. Bit lines at the same side of the second bit line are supplied with the second voltage.

10 Claims, 5 Drawing Sheets

METHODS OF PROGRAMMING AND READING ONE TIME PROGRAMMABLE READ ONLY MEMORY

CROSS-REFERENCE TO RELATED APPLICATION

This application claims the priority benefit of Taiwan application Ser. No. 87106432, filed Apr. 27, 1998, the full disclosure of which is incorporated herein by reference.

BACKGROUND OF THE INVENTION

1. Field of the Invention

The invention relates in general to a memory structure, and more particularly to methods of programming and reading one time programmable read only memory (OTP-ROM).

2. Description of the Related Art

As the function of the microprocessor becomes stronger and the program and the operation of software increase, the requirement of memory becomes higher. Therefore, it is now the most important subject of semiconductor manufacturers to fabricate low-cost and high-density memories. Memories can be briefly divined into two categories: read only memories (ROM) and random access memories. ROMs further include mask ROMs, programmable ROMs (PROM), erasable programmable ROMs (EPROM) and electrically erasable programmable ROMs (EEPROM). Random access memories include static random access memories (SRAM) and dynamic random access memories (DRAM).

ROMs are widely used in digital equipment such as personal computers and microprocessors. The process for fabricating ROMs is rather complicated and time-consuming. The processes for fabricating different types of ROMs are more or less the same except the data stored in programming are different. Therefore, ROMs are always in the forms of semi-product. As the programs from the clients are received, the particular ROMs can be quickly completed, simply by forming masks to program the ROMs. This is so-called post-programming mask ROMs.

Usually, ROMs use channel transistors as memory cells. During programming, dopants are selectively implanted into certain channel regions to modify the threshold voltage and to control memory cells ON/OFF. ROMs include polysilicon word lines (WL) acrossing bit lines (BL). The channel of a memory cell is below a word line WL and between two bit lines BLs. The implantation of ions into the channel determines the binary data "0" or "1".

FIG. 1 illustrates the layout of a conventional PROM. FIG. 2 is the cross-section of the PROM in FIG. 1 along I—I. FIG. 3 is the cross-section of the PROM in FIG. 1 along II—II. The conventional PROM can be fabricated as followed.

Referring to FIG. 1, FIG. 2, and FIG. 3, first, on a substrate 10, a pad oxide (not shown) is formed by thermal oxidation. Active regions are then defined by forming field oxide layer 14, using local oxidation. The pad oxide is then clean away by wet etching. Next, by thermal oxidation, an oxide layer 12 is formed on the surface of the device regions. Then, a polysilicon layer is formed on the oxide layer 12 by low pressure chemical vapor deposition (LPCVD). The polysilicon layer is then defined by photolithography and etching to form a polysilicon layer 16.

An inter-poly dielectric layer is then deposited on the polysilicon 16 by LPCVD. Then, another polysilicon layer is formed on the inter-poly dielectric layer by LPCVD. Next, the polysilicon layer is defined and etched down to the inter-polysilicon dielectric layer to form the polysilicon layer 20 and the inter-polysilicon dielectric layer 18. The polysilicon layer 20 is used as a word line WL.

Then, the polysilicon layer 16 is then defined and etched by using the polysilicon layer 20 as a mask so that the polysilicon layer 16 serves as a bit line BL. Next, the polysilicon layer 20 is used as a mask to perform ion implantation, whereas higher dosage of ions is implanted to form an ion implantation region 22. Then, a dielectric layer 24 is deposited by LPCVD to cover the whole substrate. The dielectric layer 24 is then etched to form a contact window 26. A metal layer 28 is then deposited into the contact window 26. The metal layer 28 contacts with the ion implantation regions 22. The metal layer 28 is used as a bit line. Sequential processes are then performed to complete PROM.

FIG. 4 illustrates a partial circuit diagram of a conventional read only access memory. FIG. 4 is an example of a 2*3 matrix including 2 arrays of memory cells and 3 columns of memory cells. FIG. 4 shows 6 memory cells, 2 word lines and 3 bit lines. Each memory cell in one array is coupled to different bit lines BL but coupled to one equal word line WL. Memory cell in one column is coupled to one equal bit line BL but memory cells in different arrays are coupled to different word lines WL.

Number 121, 122, 123, 124, 125, and 126, each represents one memory cell. Memory cells 121 and 124 both are coupled to the bit line BL1 and are coupled to the word line WL1 and the word line WL2, respectively. Memory cells 122 and 125 both are coupled to the bit line BL2 and are coupled to the word line WL1 and the word line WL2, respectively. Memory cells 123 and 126 both are coupled to the bit line BL3 and are coupled to the word line WL1 and the word line WL2, respectively. Memory cells 121, 122 and 123are all coupled to the word line WL1 and memory cells 124, 125 and 126 are all coupled to the word line WL2. Another terminals of the memory cells are coupled to the ion implantation region Vss.

However, the conventional memory cells have several drawbacks. First, during programming and reading, different voltage has to be supplied to the corresponding bit line BL, word line WL and ion implantation region Vss of each memory cell, which is complex. For example, during the programming of the memory cell 122, 12 volts has to be supplied to the word line WL1, 8 volts has to be supplied to the bit line BL2 and the ion implantation region Vss has to be grounded. However, during the programming of other memory cells in the same array, another voltage has to be supplied to the corresponding bit line BL of the memory cell. Therefore, the programming procedure is quiet laborsome. Second, it is also complicate during the procedure of "read". During the procedure of "read", different voltage has to be supplied to the corresponding bit line BL, word line WL and ion implantation region Vss of each memory cell.

Moreover, the conventional memory cell is limited to the size of the contact window can therefore can not be effectively sizedown. Also, due to the formation of field oxide, the memory cell can be greatly sizedown and the substrate surface is uneven. Moreover, using metal layer to be bit lines BL causes metal layer reflection.

SUMMARY OF THE INVENTION

It is another object of the invention to provide the methods of programming and reading an OTP-ROM. The read only memory includes a number of word lines and a number of bit lines. The word lines and the bit lines are arranged in a matrix. Between every two of the bit lines and on every word line there forms a memory cell. The two bit lines of the memory cell are a first bit line and a second bit line.

The method of programming includes the following steps. The first bit line is supplied with a first voltage. The second bit line is supplied with a second voltage. The word line is supplied with a third voltage. Bit lines at the same side of the first bit line are supplied with the first voltage. Bit lines at the same side of the second bit line are supplied with the second voltage.

The method of reading includes the following steps. The first bit line is supplied with a first voltage. The second bit line is supplied with a second voltage. The word line is supplied with a third voltage. Bit lines at the same side of the first bit line are supplied with the first voltage. Bit lines at the same side of the second bit line are supplied with the second voltage.

BRIEF DESCRIPTION OF THE DRAWINGS

Other objects, features, and advantages of the invention will become apparent from the following detailed description of the preferred but non-limiting embodiments. The description is made with reference to the accompanying drawings in which:

FIG. 5A to 5C is the cross sectional view showing the process flow of fabricating an OTP-ROM according to a preferred embodiment of the invention; wherein FIG. 5A and FIG. 5B are the cross-sections of FIG.6 along the broken line III—III and FIG. 5C is the cross-section of FIG.6 along the broken line IV—IV;

DESCRIPTION OF THE PREFERRED EMBODIMENT

Figure 5A:
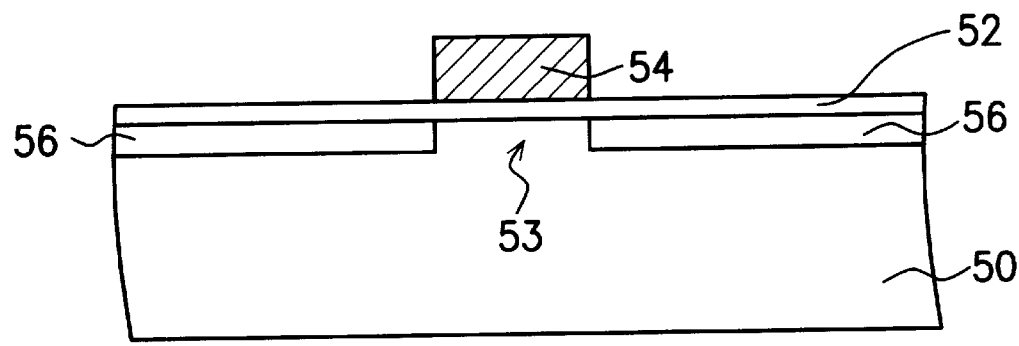

Referring to FIG. 5A, on a substrate 50, an oxide layer 52 is formed by, for example, thermal oxidation. Then, a polysilicon layer is formed on the oxide layer 52 preferably by LPCVD. Then, by photolithography and etching techniques, the polysilicon layer is defined to form a polysilicon layer 54. The polysilicon layer 54 determines the channel region 53 on the substrate 50.

Then, the polysilicon layer 54 is used as a mask to perform a self-align ion implantation in order that the dopant penetrate the oxide layer 52 and is implanted into the substrate 50 below and beside the polysilicon layer 54. An annealing step is then performed to form ion implantation regions 56. The ion implantation regions are used as buried bit line.

Figure 5B:
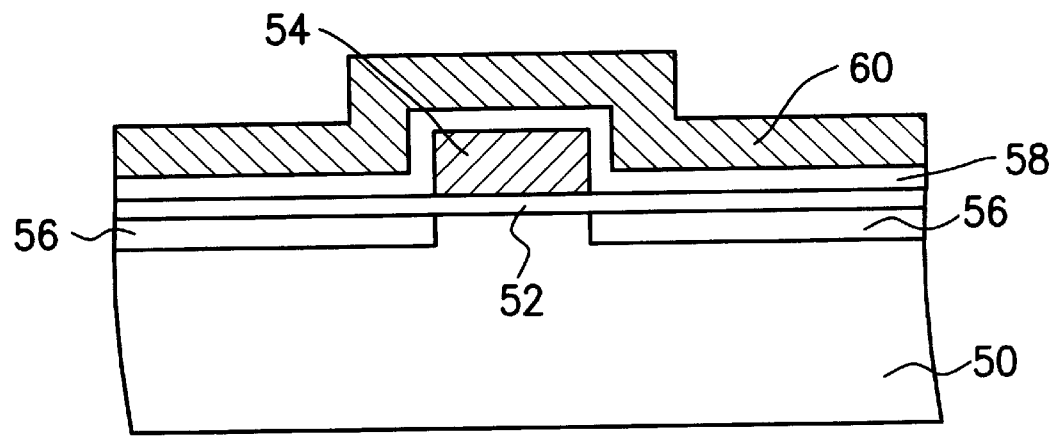

One character of the invention is that the ion implantation region 56 is formed by self-aligned ion implantation Referring to FIG. 5B, an inter-poly dielectric layer 58 is deposited preferably by LPCVD to cover the surface of the polysilicon layer 54 and the oxide layer 52. The inter-poly dielectric layer can be a multi-level structure such as an oxide/nitride/oxide layer. Then, a polysilicon layer 60 is formed on the inter-poly dielectric layer 58, for example, by LPCVD.

Figure 5C:
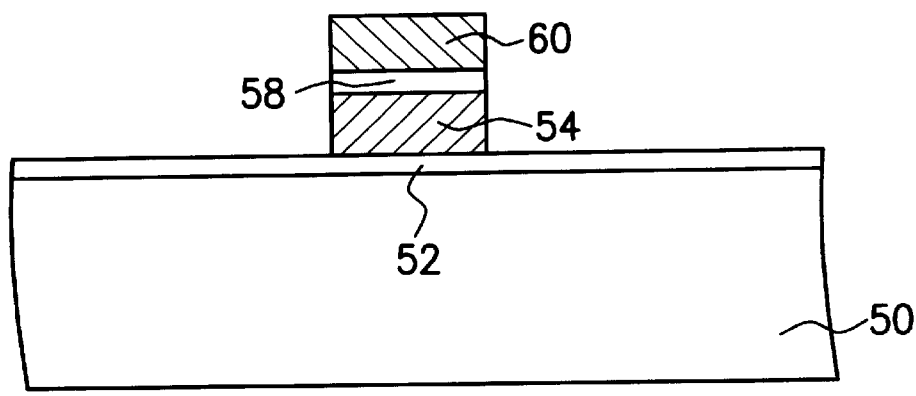

Referring to FIG. 5C, the polysilicon layer 60 is patterned by using a mask and the etching technique so that the polysilicon layer 60 forms a control gate, which is, in other words, a word line. The word line formed of the polysilicon layer 60 is substantially perpendicular to the bit line formed of the ion implantation region 56, showing a matrix arrangement. Next, the polysilicon layer 54 and the inter-poly dielectric layer 58 are further etched preferably using the same mask and the same etching technique as patterning the polysilicon layer 60 so that the polysilicon layer 54 forms a floating gate. The step for etching the polysilicon layer 54 is a self-aligned process. Then, sequentially processes are performed to accomplish he PROM. However, the sequential processes are well known for persons skilled in this art; therefore they are not described herein.

Figure 6:
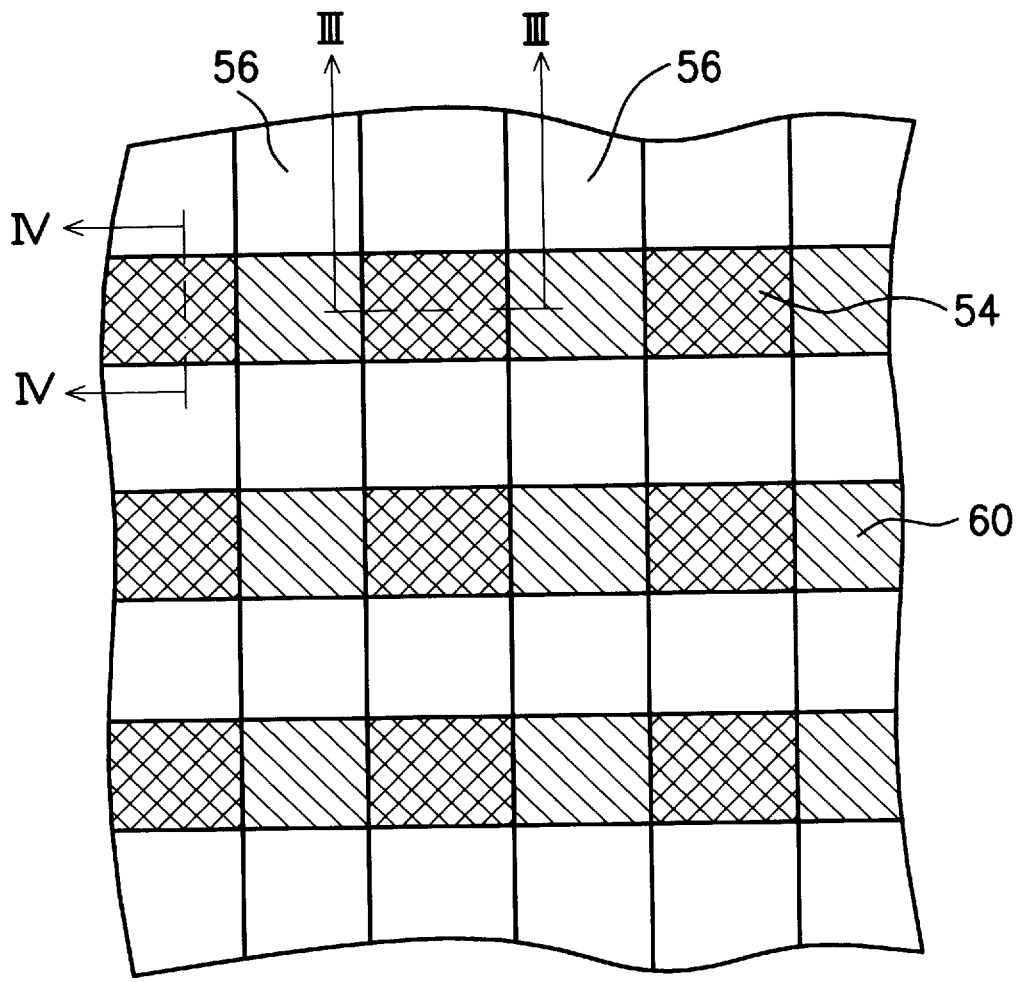
FIG. 6 is the layout of an OTP-ROM according to a preferred embodiment of the invention.

Referring to FIG. 6, FIG. 6 illustrates the layout of the OTP-ROM according to a preferred embodiment of the invention. FIG. 5A and FIG. 5B are the cross-sections of FIG.6 along the broken line III—III and FIG. 5C is the cross-section of FIG. 6 along the broken line IV—IV.

Figure 1:
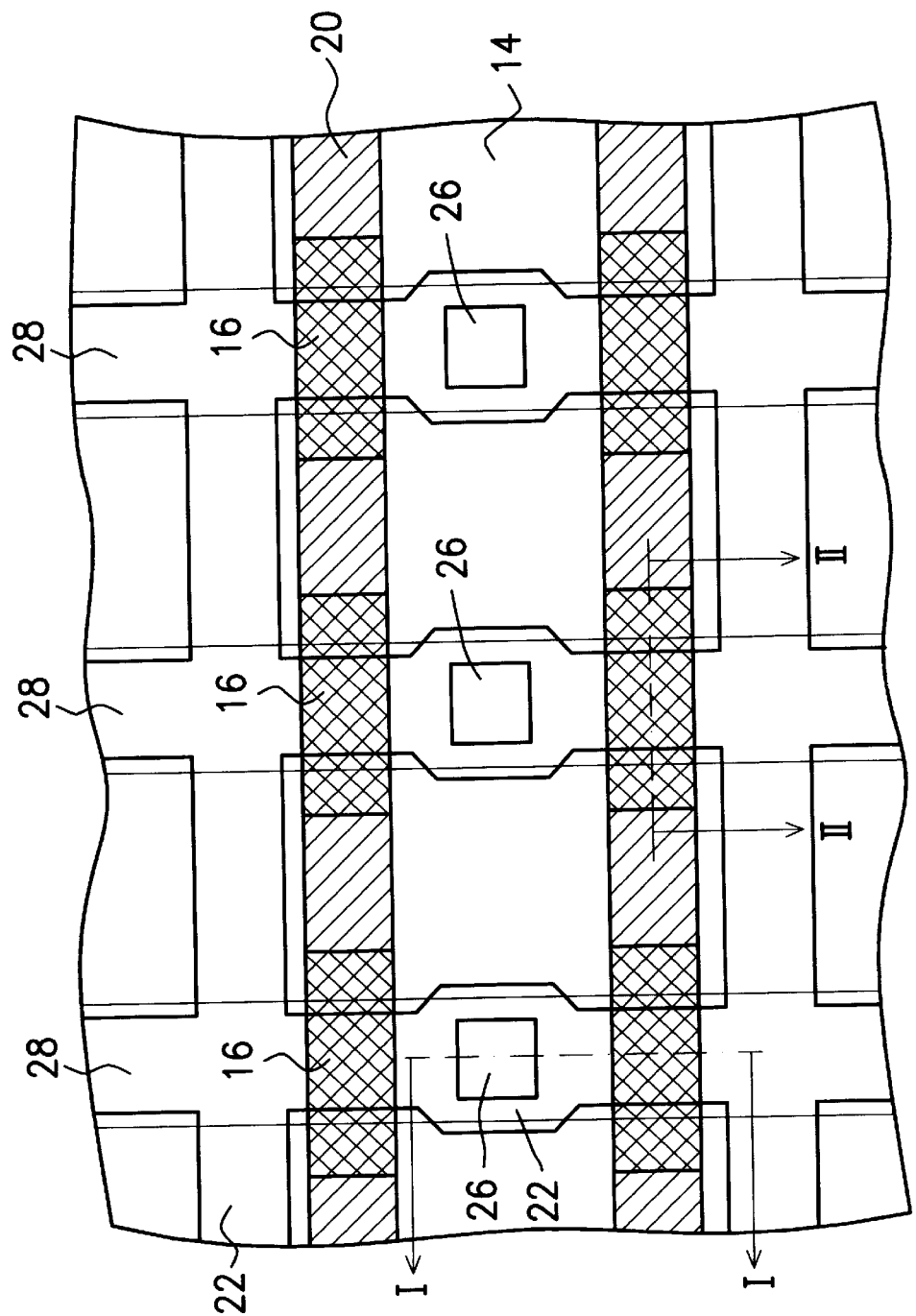
FIG. 1 is the layout of the conventional PROM.
Figure 2:
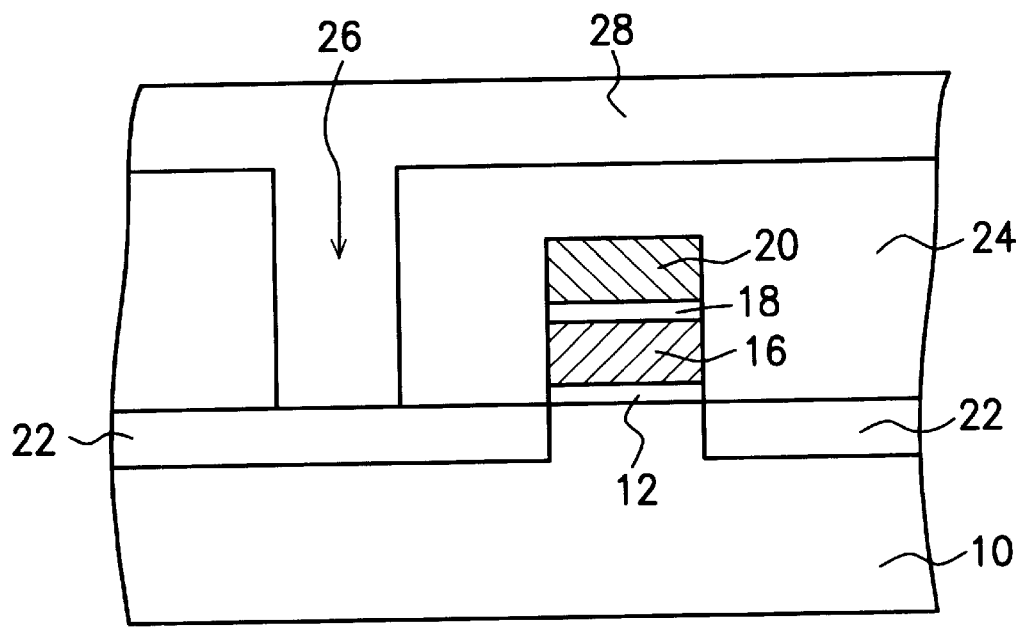
FIG. 2 is the cross-section of FIG. 1 along the broken line I—I.
Figure 3:
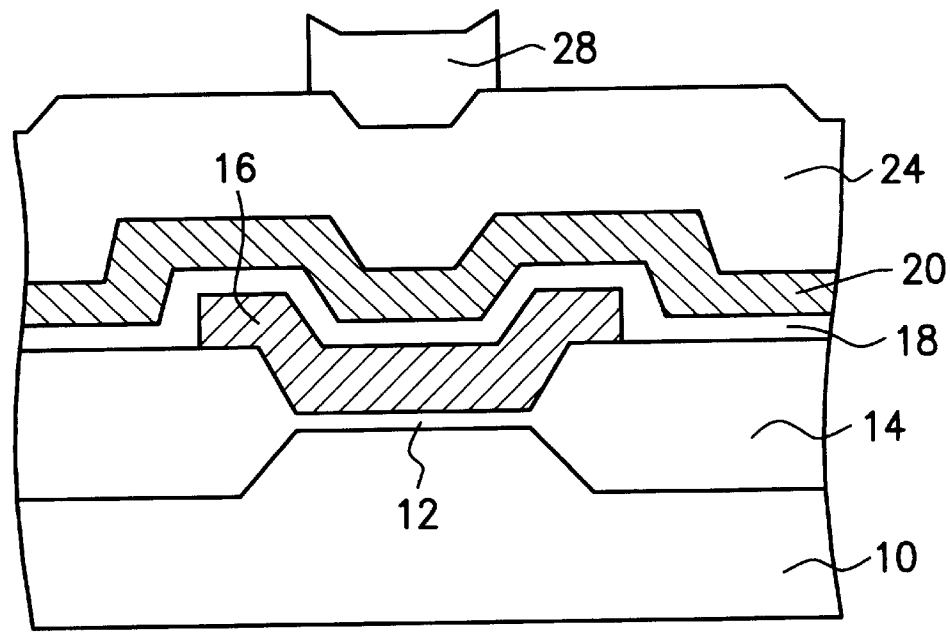
FIG. 3 is the cross-section of FIG. 1 along the broken line II—II.
Figure 4:
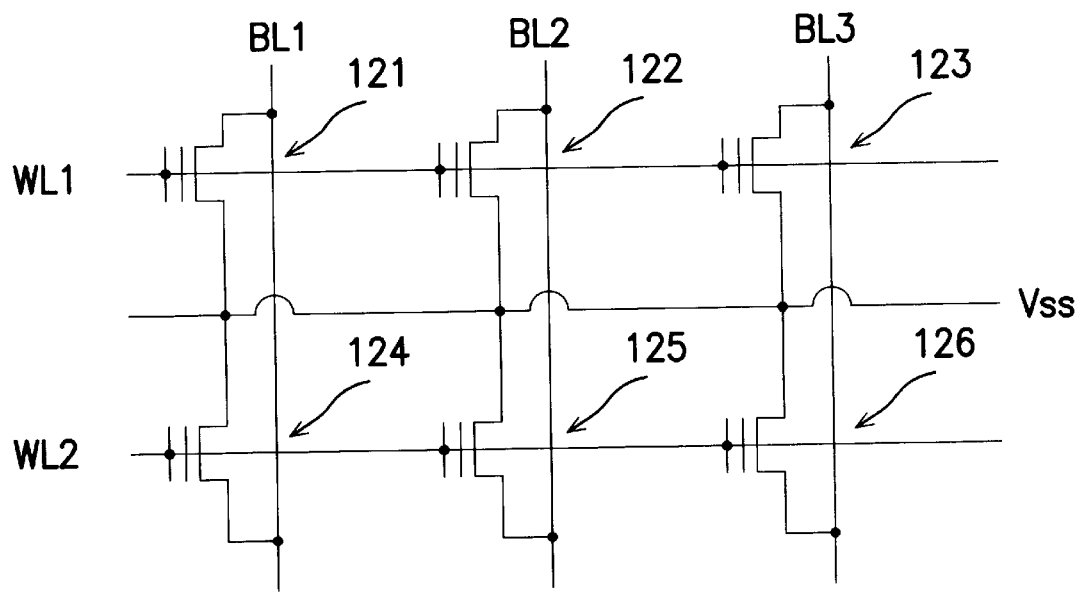
FIG. 4 is the circuit diagram of the conventional read only access memory.
Figure 7:
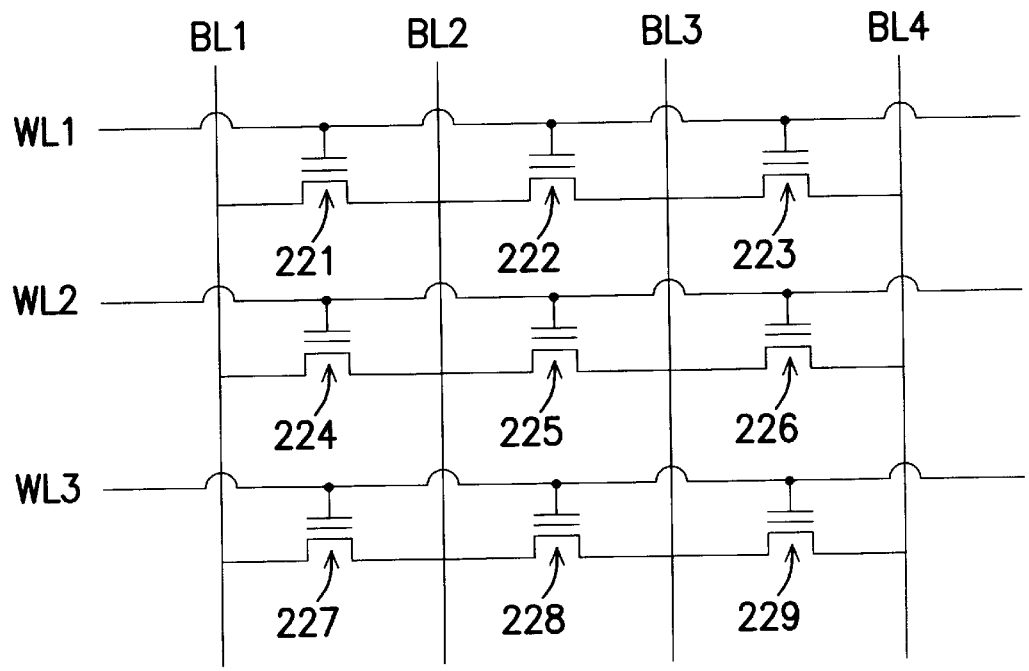
FIG. 7 is the circuit diagram of an OTP-ROM according to a preferred embodiment of the invention.

Referring to FIG. 7, a 3*3 matrix structure is taken as an example. FIG. 7 shows nine memory cells, three word lines and four bit lines. Each memory cell in one array is coupled to different bit lines but coupled to one word line. Each memory cell is one column is coupled to two word lines but memory cells in different arrays are coupled to different word lines.

Number 221, 222, 223, 224, 225, 226, 227, 228 and 229 each represents one memory cell. Memory cells 221, 224 and 227 are all coupled to the bit line BL1 and the bit line BL2 and are coupled to the word line WL1, the word line WL2 and the word line WL3, respectively. Memory cells 222, 225 and 228 are all coupled to the bit line BL2 and the bit line BL3 and are coupled to the word line WL1, the word line WL2 and the word line WL3, respectively. Memory cells 223, 226 and 229 are all coupled to the bit line BL3 and the bit line BL4 and are coupled to the word line WL1, the word line WL2 and the word line WL3, respectively.

The OTP-ROM of the invention has simpler procedure of "read" and "write" than the conventional one. For example, during programming the memory cell 222, only a voltage, such as 8 volts, has to be supplied to the bit line BL2. Bit lines at one side of the memory cell 222 are grounded. These grounded bit lines can be, for example, BL3, BL4. Bit lines at another side of the memory cell 222 is supplied with a voltage of, for example, 8 volts and these bit lines can be such as BL1. The voltage difference of the bit line BL2 and the bit line BL3 has to be large enough for programming. Another voltage sufficient for programming, such as 12 volts, is supplied to the word line WL1 coupled to the memory cell 222 while the other word lines are grounded.

During, the procedure of "reading", only one voltage has to be supplied to the selected memory cell. The voltage is, for example, 1.5 volts. The voltage supplied to bit lines at one side of the memory cell is 0. The voltage supplied to bit lines at another side of the memory cell is substantially equal to the voltage supplied to the memory cell. Another voltage, such as 5 volts, is supplied to the word line coupled to the selected memory cell while the other word lines are grounded.

According to the invention, an ion implantation region is formed to be buried bit lines so that source region and drain region are inter-changeable. It is so-called "bi-lateral programming". The damage during programming is reduced and the flexibility of reading is increased.

Moreover, the OTP-ROM of the invention has similar density as the stacked memory cell but is simpler in the procedure of "reading" than the stacked memory cell.

One character of the invention is that the buried bit line is formed by self-aligned ion implantation to the polysilicon layer 54. Therefore, no contact window has to be formed and no necessity of filling metal. Moreover, no field oxide has to be formed. Consequently, the OTP-ROM of the invention has superior planarity and smaller size.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of programming an one time programmable read only memory (OTP-ROM), wherein the OTP-ROM comprises a plurality of word lines and a plurality of bit lines, the word lines and the bit lines are arranged in a matrix and between every two of the bit lines and on every word line there forms a memory cell, wherein the two bit lines of the memory cell are a first bit line and a second bit line, wherein the method of programming comprises:

supplying a first voltage to the first bit line;

supplying a second voltage to the second bit line;

supplying a third voltage to the word line;

supplying said first voltage to bit lines at the same side of the first bit line; and supplying said second voltage to bit lines at the same side of the second bit line.

2. A method according to claim 1, wherein the first voltage is 8 volts.

3. A method according to claim 1, wherein the second voltage is a grounded voltage.

4. A method according to claim 1, wherein the third voltage is 12 volts.

5. A method according to claim 1, wherein the first bit line and the second bit line are inter-changeable before supplying the first voltage and the second voltage.

6. A method of reading an one time programmable read only memory (OTP-ROM), wherein the OTP-ROM comprises a plurality of word lines and a plurality of bit lines, the word lines and the bit lines are arranged in a matrix and between every two of the bit lines and on every word line there forms a memory cell, wherein the two bit lines of the memory cell are a first bit line and a second bit line, wherein the method of programming comprises:

supplying a first voltage to the first bit line;

supplying a second voltage to the second bit line;

supplying a third voltage to the word line;

supplying said first voltage to bit lines at the same side of the first bit line; and supplying said second voltage to bit lines at the same side of the second bit line.

7. A method according to claim 6, wherein the first voltage is 1.5 volts.

8. A method according to claim 6, wherein the second voltage is a grounded voltage.

9. A method according to claim 6, wherein the third voltage is 5 volts.

10. A method according to claim 6, wherein the first bit line and the second bit line are inter-changeable before supplying the first voltage and the second voltage.

* * * * *